United States Patent
Dong et al.

(10) Patent No.: US 12,302,512 B2
(45) Date of Patent: May 13, 2025

(54) FLEXIBLE DISPLAY DEVICE AND SLIDING-SCROLLING METHOD THEREFOR

(71) Applicant: BOE Technology Group Co., Ltd., Beijing (CN)

(72) Inventors: Liming Dong, Beijing (CN); Zhao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 257 days.

(21) Appl. No.: 17/776,224

(22) PCT Filed: Jul. 6, 2021

(86) PCT No.: PCT/CN2021/104800
§ 371 (c)(1),
(2) Date: May 12, 2022

(87) PCT Pub. No.: WO2022/042056
PCT Pub. Date: Mar. 3, 2022

(65) Prior Publication Data
US 2022/0386485 A1    Dec. 1, 2022

(30) Foreign Application Priority Data
Aug. 25, 2020  (CN) .......................... 202010863096.X

(51) Int. Cl.
*H05K 5/00*  (2025.01)
*H05K 5/02*  (2006.01)

(52) U.S. Cl.
CPC ......... *H05K 5/0217* (2013.01); *H05K 5/0018* (2022.08)

(58) Field of Classification Search
CPC .. H05K 5/0217; H05K 5/0018; G06F 1/1624; G06F 1/1652; G09F 9/301
See application file for complete search history.

(56) References Cited

U.S. PATENT DOCUMENTS

| | | | | |
|---|---|---|---|---|
| 10,331,173 B2 * | 6/2019 | Cho | ......................... | G09F 9/301 |
| 10,747,269 B1 * | 8/2020 | Choi | ..................... | G06F 1/1652 |
| 10,827,620 B2 * | 11/2020 | Lin | ............................ | G06F 1/16 |
| 11,270,606 B2 * | 3/2022 | Kwon | ................. | H05K 5/0017 |
| 11,334,118 B2 * | 5/2022 | Song | ..................... | G06F 1/1677 |

(Continued)

FOREIGN PATENT DOCUMENTS

| CN | 207781089 U | 8/2018 |
|---|---|---|
| CN | 110211506 A | 9/2019 |

(Continued)

OTHER PUBLICATIONS

International Search Report issued Sep. 28, 2021 in corresponding International Patent Application No. PCT/CN2021/104800 (with English translation), 4 pages.

(Continued)

*Primary Examiner* — Rockshana D Chowdhury
(74) *Attorney, Agent, or Firm* — XSENSUS LLP

(57) ABSTRACT

A flexible display device includes: a shell; a flexible display panel, having a first end and a second end arranged opposite to each other; a fixed support member, fixedly connected with the first end of the flexible display panel for supporting the first end of the flexible display panel, the fixed support member being movably connected to the shell; a sliding reel, where the flexible display panel is rolled on the sliding reel, and the sliding reel is rotatably arranged in the shell; and a support member, rolled on the sliding reel and located between the sliding reel and the flexible display panel, where an end of the support member is fixedly connected with the sliding reel, an opposite end of the support member is fixedly connected with the fixed support member, and the support member is configured to support the flexible display panel when the flexible display panel is expanded.

18 Claims, 4 Drawing Sheets

(56) References Cited

U.S. PATENT DOCUMENTS

| | | | | |
|---|---|---|---|---|
| 11,369,029 B2* | 6/2022 | Luo | ...................... | H05K 5/0017 |
| 11,849,551 B2* | 12/2023 | Choi | .................... | H10K 77/111 |
| 11,910,549 B2* | 2/2024 | Ko | ........................ | G06F 1/1624 |
| 11,914,423 B2* | 2/2024 | Shin | .................... | H04M 1/0268 |
| 11,940,842 B2* | 3/2024 | Kang | ....................... | G06F 1/16 |
| 12,016,142 B2* | 6/2024 | Jiang | .................... | G06F 1/1652 |
| 2013/0058063 A1* | 3/2013 | O'Brien | ................ | G06F 1/1624 |
| | | | | 361/807 |
| 2016/0155965 A1* | 6/2016 | Kusuura | ................ | H10K 71/50 |
| | | | | 29/829 |
| 2022/0182477 A1* | 6/2022 | Kim | .................... | H04M 1/0268 |
| 2022/0221907 A1* | 7/2022 | Cai | ...................... | G06F 1/1624 |

FOREIGN PATENT DOCUMENTS

| | | | |
|---|---|---|---|
| CN | 110491289 A | 11/2019 | |
| CN | 110580859 A | 12/2019 | |
| CN | 110868486 A | 3/2020 | |
| CN | 111425725 A | 7/2020 | |
| CN | 111508362 A | 8/2020 | |
| CN | 111862822 A | 10/2020 | |
| CN | 212302933 U | 1/2021 | |
| KR | 20190108668 A | 9/2019 | |
| KR | 20190114863 A | 10/2019 | |
| WO | 2019177427 A2 | 9/2019 | |
| WO | 2021000860 A1 | 1/2021 | |

OTHER PUBLICATIONS

Written Opinion issued Mar. 3, 2022 in corresponding International Patent Application No. PCT/CN2021/104800 (with English translation), 4 pages.

* cited by examiner

FLEXIBLE DISPLAY DEVICE AND SLIDING-SCROLLING METHOD THEREFOR

CROSS-REFERENCE TO RELATED APPLICATIONS

This application is the U.S. national phase application of PCT Application No. PCT/CN2021/104800, filed Jul. 6, 2021, which claims the priority of a Chinese patent application No. 202010863096.X, filed Aug. 25, 2020, and titled "Flexible Display Device and Sliding-Scrolling Method Therefor", the entire content of which is incorporated herein by reference.

TECHNICAL FIELD

The disclosure relates to the field of display technology, and in particular, to a flexible display device and a sliding-scrolling method for the flexible display device.

BACKGROUND

With the vigorous development of science and technology, the flexible display panel has gradually realized mass production and commercialization. At present, the mainstream application form of the flexible display panel on the market is the foldable form, which may be further subdivided into the inward folding form and the outward folding form according to the inward or outward direction which the display surface towards in a folded state. The foldable form brings a brand new terminal experience to consumers, while it is also subject to some limitations, for example, the display region of the flexible display panel can only be switched between two display areas.

Sliding-scrolling is another innovative application field of the flexible display panel, which enables consumers to switch the area of the display region of the flexible panel at will according to their own needs. Therefore it is not only convenient for user to carry around, but also provides better user experience than the foldable display panel, so that the sliding-scrolling becomes an important direction for the development of the flexible display panel. However, in the current sliding-scrolling mechanism, the flexible display panel does not have good support when the sliding-scrolling region is in a flattened state, thereby causing the flexible display panel to be easily damaged during its usage, and resulting in poor display. Moreover, the touch sense of the sliding-scrolling region during its usage is poor, thereby resulting in bad user experience.

The above information disclosed in the background section is only to enhance the understanding of the background of the disclosure, and therefore it may contain information that does not constitute the prior art known to those skilled in the art.

SUMMARY

The purpose of the disclosure is to provide a flexible display device and a sliding-scrolling method for the flexible display device, so as to overcome one or more problems caused by limitations and defects of the related art at least to a certain extent.

According to an aspect of the disclosure, there is provided a flexible display device, including:
a shell;
a flexible display panel, having a first end and a second end arranged opposite to each other;
a fixed support member, fixedly connected with the first end of the flexible display panel for supporting the first end of the flexible display panel, the fixed support member being movably connected to the shell;
a sliding reel, on which the flexible display panel is rolled, the sliding reel being rotatably arranged in the shell; and
a support member, rolled on the sliding reel and located between the sliding reel and the flexible display panel, where an end of the support member is fixedly connected with the sliding reel, an opposite end of the support member is fixedly connected with the fixed support member, and the support member is configured to support the flexible display panel when the flexible display panel is expanded.

In some embodiments of the disclosure, the support member includes:
a plurality of rigid support plates, extending along an axial direction of the sliding reel, and an interval space is provided between any two adjacent rigid support plates; and
a plurality of flexible support plates, extending along the axial direction of the sliding reel, and one flexible support plate is connected between any two adjacent rigid support plates.

In some embodiments of the disclosure, the material of the rigid support plate is magnetically conductive metal.

In some embodiments of the disclosure, a coil is wound outside the rigid support plate; and the flexible display panel includes a metal support layer which is located on a side of the flexible display panel attaching with the support member, the material of the metal support layer is magnetically conductive metal, and the metal support layer is able to be attached to the rigid support plate which is energized.

In some embodiments of the disclosure, the sliding reel includes:
a sliding reel column; and
two baffles, correspondingly fixed at two opposite ends of the sliding reel column, and a diameter of the baffle is greater than a diameter of the sliding reel column.

In some embodiments of the disclosure, a plurality of annular grooves are provided on the sliding reel column side by side along the axial direction of the sliding reel, and the annular grooves are coaxially arranged with the sliding reel column.

In some embodiments of the disclosure, the support member includes a plurality of support strips which are arranged side by side along the axial direction of the sliding reel, and each of the support strips is matched with one of the annular grooves.

In some embodiments of the disclosure, a width of an annular groove close to the baffle is greater than a width of an annular groove away from the baffle, and a width of a support strip close to the baffle is greater than a width of a support strip away from the baffle.

In some embodiments of the disclosure, a plurality of first protruding strips are arranged on a side of the support member which is matched with the flexible display panel, and the first protruding strips extend along the axial direction of the sliding reel.

In some embodiments of the disclosure, a plurality of grooves matched with the first protruding strips are arranged on a side of the flexible display panel which is matched with the support member, and the grooves extend along the axial direction of the sliding reel.

In some embodiments of the disclosure, the flexible display device further includes:
an elastic member, connected between the shell and the second end of the flexible display panel.

In some embodiments of the disclosure, the support member is formed in a plate shape and provided with a plurality of through holes, and the material of the support member is metal or colloid.

According to an aspect of the disclosure, there is provided a sliding-scrolling method for a flexible display device, used for the flexible display device according to any one of the above embodiments, including:
moving the sliding reel towards a side away from the fixed support member, and expanding the support member and the flexible display panel which are rolled on the sliding reel, where the support member is configured to support the flexible display panel.

In some embodiments of the disclosure, when the flexible display panel is expanded to a preset position, a coil on the rigid support plate is energized so as to enable the rigid support plate to be attached to the flexible display panel.

Other features and advantages of the disclosure will become apparent from the following detailed description, or be learned in part by practice of the present disclosure.

It is to be understood that the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the disclosure, and for those of ordinary skill in the an, other drawings can also be obtained from these drawings without creative effort.

DETAILED DESCRIPTION

Figure 1:
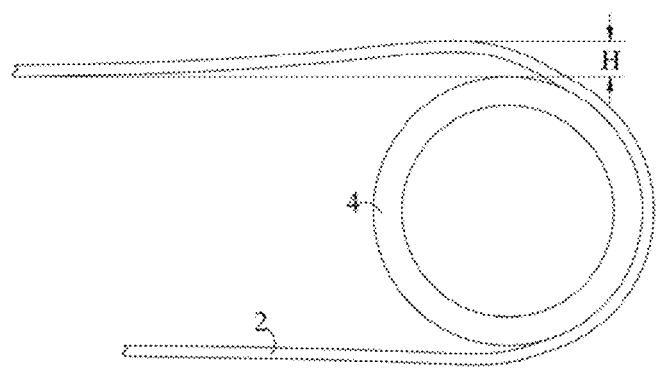
FIG. 1 is a schematic structural diagram illustrating warping deformation of a flexible display panel in the related art when folded outward.

Exemplary embodiments will now be described more fully with reference to the accompanying drawings. Exemplary embodiments, however, can be embodied in various forms and should not be construed as limited to the embodiments set forth herein. Instead, these embodiments are provided so that the disclosure will be thorough and complete, and will fully convey the concept of exemplary embodiments to those skilled in the art. The same reference numerals in the drawings denote the same or similar structures, and thus the detailed description thereof will be omitted.

Referring to the schematic structural diagram of warping deformation of the flexible display panel in the related art when folded outward as shown in FIG. 1, in the related art, a sliding-scrolling region of a flexible display panel 2 may be designed to be relative thick so as to support itself. However, the greater the thickness of the flexible display panel 2, the greater the warpage H after being wound on a sliding reel 4 and the greater the rebound force. Accordingly, when the flexible display panel 2 is rolled, a neutral layer of a functional layer (display functional layer and touch functional layer) of the flexible display panel 2 moves down, and the strain of the functional layer increases, thereby increasing the risk of bending failure.

Figure 2:
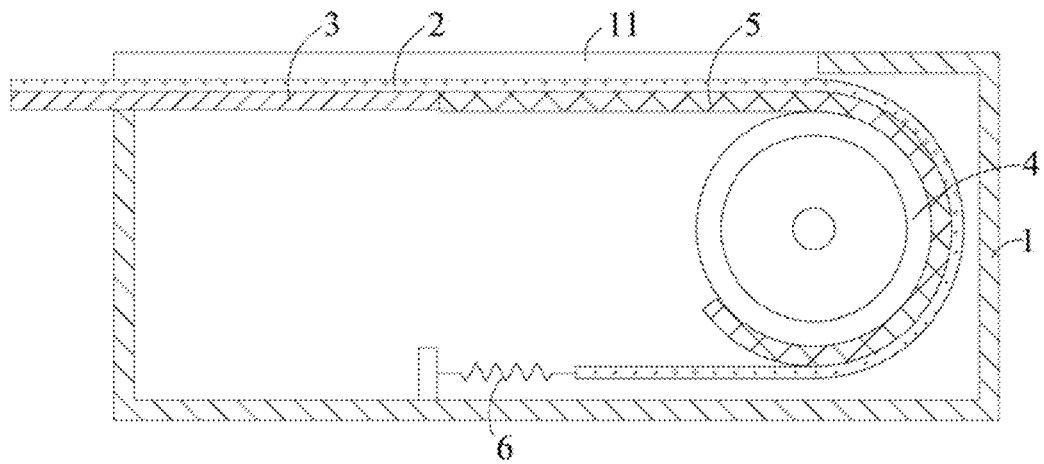
FIG. 2 is a schematic structural diagram illustrating an exemplary embodiment of a flexible display device according to the disclosure.

Exemplary embodiments first provide a flexible display device. Referring to the schematic structural diagram of some embodiments of the flexible display device of the disclosure as shown in FIG. 2, the flexible display device may include a shell 1, a flexible display panel 2, a fixed support member 3, a sliding reel 4, a support member 5 and an elastic member 6. The flexible display panel 2 has a first end and a second end arranged opposite to each other. The fixed support member 3 is fixedly connected with the first end of the flexible display panel 2 for supporting the first end of the flexible display panel 2. The flexible display panel 2 is rolled on the sliding reel 4. The support member 5 is rolled on the sliding reel 4 and located between the sliding reel 4 and the flexible display panel 2, where an end of the support member 5 is fixedly connected with the sliding reel 4, an opposite end of the support member 5 is fixedly connected with the fixed support member 3, and the support member 5 is configured to support the flexible display panel 2 when the flexible display panel 2 is expanded.

Figure 3:
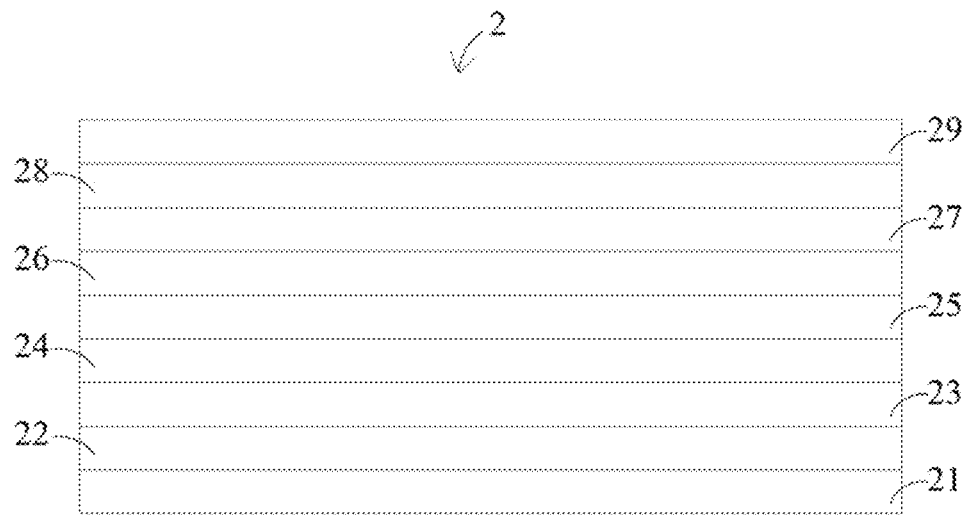
FIG. 3 is a schematic structural diagram of the flexible display panel in FIG. 2.

In some exemplary embodiments, referring to the schematic structural diagram of the flexible display panel of FIG. 2 as shown in FIG. 3, the flexible display panel 2 may include a metal support layer 21, a first optical adhesive layer 22, a back film 23, and a first pressure sensitive adhesive (PSA) silica gel layer 24, a display layer 25, a second PSA silica gel layer 26, a polarizer 27, a second optical adhesive layer 28 and a cover plate 29. The first optical adhesive layer 22 is arranged on the metal support layer 21. The back film 23 is arranged on a side of the first optical adhesive layer 22 away from the metal support layer 21. The first PSA silica gel layer 24 is arranged on a side of the back film 23 away from the metal support layer 21. The display layer 25 is arranged on a side of the first PSA silica gel layer 24 away from the metal support layer 21. The second PSA silica gel layer 26 is arranged on a side of the display layer 25 away from the metal support layer 21. The polarizer 27 is arranged on a side of the second PSA silica gel layer 26 away from the metal support layer 21. The second optical adhesive layer 28 is arranged on a side of the polarizer 27 away from the metal support layer 21. The cover plate 29 is arranged on a side of the second optical adhesive layer 28 away from the metal support layer 21. The material of the cover plate 29 is transparent polyimide resin. The thickness of the metal support layer 21 may be greater than or equal to 30 μm and less than or equal to 40 μm.

Referring back to FIG. 2, in some exemplary embodiments, the shell 1 may be configured as a cuboid, and the shell 1 is provided with an opening 11 through which the flexible display panel 2 can display.

The fixed support member 3 may be formed in a plate shape, a surface of the first end of the flexible display panel 2, which is opposite to its display surface, may be bonded on the fixed support member 3, and the fixed support member 3 is able to support the first end of the flexible display panel 2. A width of the fixed support member 3 is greater than a width of the flexible display panel 2, so that both ends of the fixed support member 3 in the width direction protrude from the flexible display panel 2. Guide grooves (not shown in the drawing) may be arranged on two opposite inner side walls of the shell 1, and an extension direction of the guide groove is consistent with a moving direction of the fixed support member 3. Both ends of the fixed support member 3 protruding from the flexible display panel 2 are located within the guide grooves, so that the fixed support member 3 can slide in the guide grooves and move relative to the shell 1. Linear bearings may also be arranged at both ends of the fixed support member 3, so as to match with the guide grooves. It should be understood that guide rails may also be arranged on the two opposite inner side walls of the shell 1, and sliding blocks may also be arranged on the fixed support member 3 and able to slide within the guide rails, thereby enabling the fixed support member 3 to be movable.

In some exemplary embodiments, the width refer to the dimension in an axial direction of the sliding reel 4, and the length refer to the dimension perpendicular to the axial direction of the sliding reel 4.

In some exemplary embodiments, both ends of the sliding reel 4 may be fixed on two opposite inner side walls of the shell 1 through bearings, and the two opposite inner side walls matched with the sliding reel 4 are the same as the two opposite inner side walls matched with the fixed support member 3.

The elastic member 6 is connected between the shell 1 and the second end of the flexible display panel 2. The elastic member 6 may be a spring with constant tension, that is, a constant tension spring. The elastic member 6 can provide constant tension for the flexible display panel 2, so as to keep the flexible display panel 2 in a tensioned state all the time, and enable the flexible display panel 2 to closely fit with the support member 5 and the support member 5 to closely fit with the sliding reel 4. In some other exemplary embodiments of the disclosure, the elastic member 6 may also be a rubber band.

An end of the support member 5 may be fixedly connected with the sliding reel 4 by means of welding, hinging, screws, and the like, and an opposite end of the support member 5 may also be fixedly connected with the fixed support member 3 by means of welding, hinging, screws, and the like. The support member 5 is rolled on the sliding reel 4 and located between the sliding reel 4 and the flexible display panel 2, that is, the support member 5 and the flexible display panel 2 are rolled on the sliding reel 4 in sequence.

Figure 4:
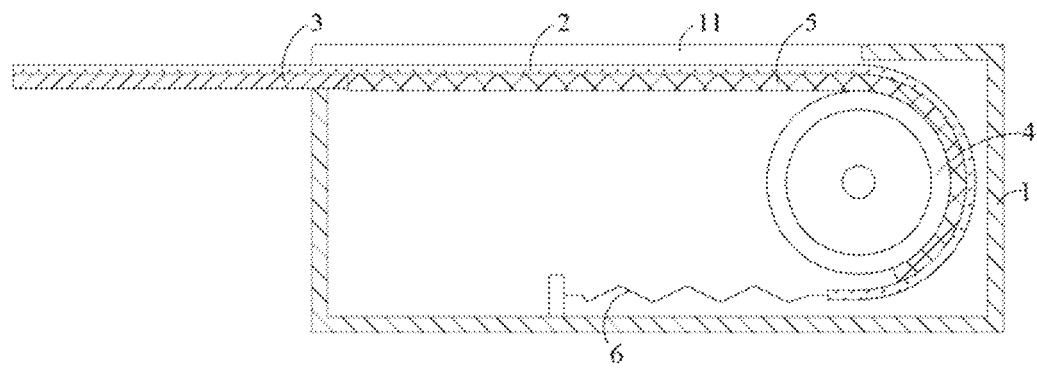
FIG. 4 is a schematic structural diagram of the flexible display device in FIG. 2 when expanded.

Now the schematic structural diagram of the flexible display device in FIG. 2 when expanded as shown in FIG. 4 is referred to. When the flexible display panel 2 is expanded, the supporter member 5 is also expanded and is able to support the flexible display panel 2. Therefore, the flexible display panel 2 is supported in the flattened state, so that the flexible display panel 2 is not easy to be damaged when used by a user, thereby avoiding poor display, and poor touch sense of the region during usage as well as poor user experience. Moreover, the flexible display panel 2 has no need to be designed as too thick for supporting itself, so that the warpage H of the flexible display panel 2 can be reduced when the thickness of the flexible display panel 2 is reduced.

Figure 5:
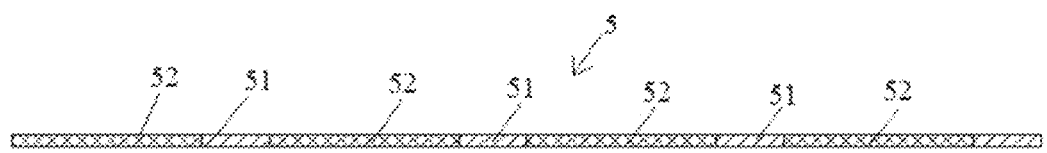
FIG. 5 is a schematic structural diagram of a support member in FIG. 2.

In the some exemplary embodiments, as shown in FIG. 5, the support member 5 may include a plurality of rigid support plates 51 and a plurality of flexible support plates 52. The rigid support plate 51 is provided in a long strip shape, and the flexible support plate 52 is also provided in a long strip shape. A length direction of the rigid support plate 51 extends along the axial direction of the sliding reel 4, that is, the length direction of the rigid support plate 51 is consistent with the axial direction of the sliding reel 4. A length direction of the flexible support plate 52 extends along the axial direction of the sliding reel 4, that is, the length direction of the flexible support plate 52 is consistent with the axial direction of the sliding reel 4. An interval space is provided between any two adjacent rigid support plates 51, and the flexible support plate 52 is connected between any two adjacent rigid support plates 51. The material of the flexible support plate 52 may be silica gel, or may be rubber, plastic, or the like. The support member 5 may be an integral body formed by the plurality of rigid support plates 51 being injection molded together with silica gel. The rigid support plates 51 are able to provide support for the flexible display panel 2, and the flexible support plates 52 are connected with the rigid support plates 51 and facilitate the bending of the support member 5. The thickness of the support member 5 may be greater than or equal to 100 μm and less than or equal to 200 μm. The length of the support member 5 is about 150 mm, and the width is about 12 mm. Alternatively, the length and width of the support member 5 may be determined according to the length and width of the flexible display panel 2 that needs to be supported, and generally, the width of the support member 5 is designed to be slightly greater than the width of the flexible display panel 2.

The material of the rigid support plate 51 may be a magnetically conductive metal, for example, it may be iron, cobalt, nickel, and any substance carried with iron, cobalt, or nickel, preferably for example, soft iron or silicon steel material. The outside of the rigid support plate 51 is wound by a conductive winding (coil) which matches its power, so that each rigid support plate 51 forms one electromagnet, and the plurality of the rigid support plates 51 form a plurality of electromagnets. Four rigid support plates 51 may be wound by one wire in sequence, and the winding direction may be set according to needs. In other words, the four rigid support plates 51 form one common magnetic body which can gain or lose magnetism at the same time. By leading out two terminals from the wire wound around the four rigid support plates 51 and connecting the two terminals to a power supply, the support member 5 can be made to be magnetic. The support member 5 with magnetism can be attached to the metal support layer 21 on the flexible display panel 2. Alternatively, the material of the metal support layer 21 may also be a magnetically conductive metal, for example, it may be iron, cobalt, nickel and any substance carried with iron, cobalt, nickel, preferably for example, soft iron or silicon steel material. In this way, the metal support layer 21 can be attached to the rigid support plate 51 which is energized (provided with electricity). The support member 5 may be controlled to have magnetism when the flexible display device is in the flattened state, thereby being attached to the metal support layer 21 on the flexible display panel 2. When the flexible display device is in a rolled state, is rolling and unrolling, the support member 5 is controlled to have no magnetism, thereby being unable to be attached to the metal support layer 21 on the flexible display panel 2. The magnetism of the rigid support plate 51 may be arranged in multiple segments, so as to meet the requirement of segmented expanding of the flexible display device. In other words, the part of the rigid support plates 51 in the flattened state are magnetic, and the part of the rigid support plate 51 in the rolled state are not magnetic. In some other exemplary embodiments of the disclosure, two, three, five or more rigid support plates 51 may be arranged in one group to form one electromagnet which can gain or lose magnetism at the same time.

Figure 6:
FIG. 6 is a schematic structural diagram of another exemplary embodiment of the support member.
Figure 7:
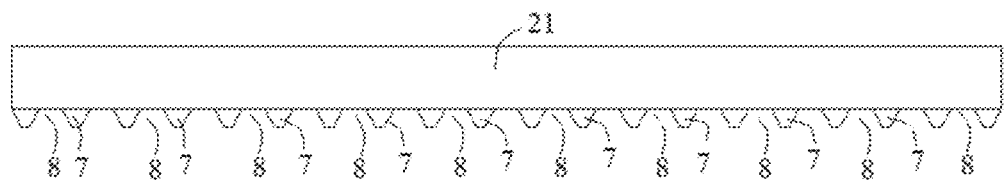
FIG. 7 is a schematic structural diagram illustrating a part of the flexible display panel which is matched with the support member in FIG. 6.

In addition, in some other exemplary embodiments of the disclosure, as shown in FIG. 6, a plurality of first protruding strips 54 may be arranged on a side of the support member 5 which is matched with the flexible display panel 2. The first protruding strips 54 extend along the axial direction of the sliding reel 4, the cross-sectional shape of the first protruding strip 54 perpendicular to the axial direction of the sliding reel 4 may be formed in an isosceles trapezoid, and a long side of the isosceles trapezoid is connected to the support member 5, and a short side of the isosceles trapezoid is away from the support member 5. The plurality of first protruding strips 54 are arranged parallel to each other, and an interval space is provided between any two adjacent first protruding strips 54. Referring to FIG. 7, a surface of the flexible display panel 2 which is matched with the support member 5 is provided with a plurality of grooves 8 which is matched with the plurality of the first protruding strips 54. The grooves 8 extend along the axial direction of the sliding reel 4. The cross-sectional shape of the groove 8 perpendicular to the axial direction of the sliding reel 4 may be formed in an isosceles trapezoid, and the length, width and depth of the groove 8 are respectively greater than the length, width and height of the first protruding strip 54. A long side of the isosceles trapezoid is close to the flexible display panel 2, and a short side of the isosceles trapezoid is away from the flexible display panel 2. It can be understood that the grooves 8 may be formed and surrounded by second protruding strips 7 which are provided on a surface of the flexible display panel 2 matched with the support member 5, and the second protruding strips 7 extend along the axial direction of the sliding reel 4. After the support member 5 is matched with the flexible display panel 2, the second protruding strip 7 is clamped into the interval space between two adjacent first protruding strips 54, and the first protruding bar 54 is clamped into the groove 8 formed by two adjacent second protruding strips 7. It can be understood that the first protruding strip 54 and the groove 8 may be provided based on the above-mentioned structure in which the rigid support plate 51 is provided as an electromagnet, or may be provided based on a structure in which the rigid support plate 51 is not provided as an electromagnet.

Figure 8:
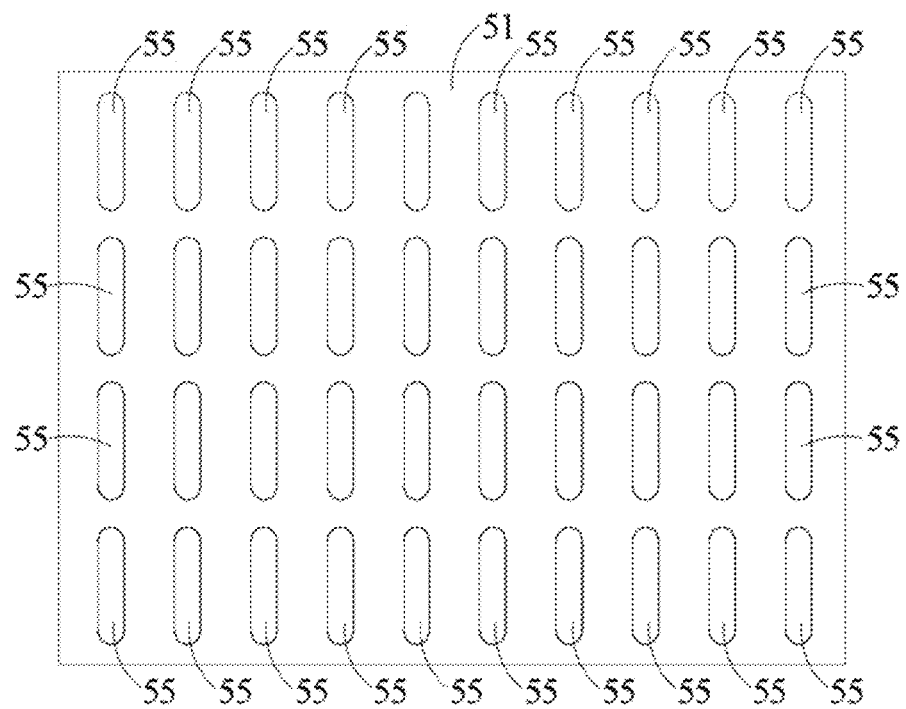
FIG. 8 is a schematic structural diagram of still another exemplary embodiment of the support member.

The structure of the support member 5 is not limited to the above description. In some other exemplary embodiments of the disclosure, as shown in FIG. 8, the support member 5 may include a rigid support plate 51 on which a plurality of strip-shaped through holes are arranged. The plurality of strip-shaped through holes 55 may be arranged in an array, and may also not be arranged in an array. The strip-shaped through holes 55 may be filled with silica gel, rubber, and the like. The shape of the strip-shaped through holes 55 may be a capsule hole, an ellipse, a rectangle, and the like. Alternatively, it may also be configured as a circular through hole, a square through hole, and the like. The strip-shaped through holes may be not filled with silica gel. A whole-surface rigid support plate 51 may be adopted, and the thickness of the rigid support plate 51 may be greater than or equal to 30 μm and less than or equal to 50 μm. A whole-surface colloidal material may be also adopted, such as silica gel, rubber, and the like, and the thickness of the colloidal material may be less than or equal to 1 mm. Alternatively, a flat plate of colloidal material with patterns may be also adopted, that is, through holes are arranged on the flat plate of colloidal material, and the thickness of the flat plate of colloidal material may be less than or equal to 2 mm.

Figure 9:
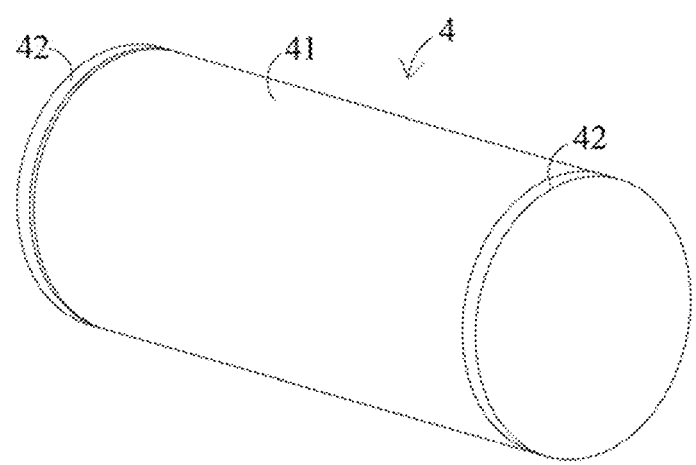
FIG. 9 is a schematic structural diagram of a sliding reel in FIG. 2.

In some exemplary embodiments, as shown in FIG. 9, the sliding reel 4 may include a sliding reel column 41 and two baffles 42 which are correspondingly fixed at opposite ends of the sliding reel column 41, that is, each end surface of the sliding reel column 41 is fixed with one baffle 42. The baffle 42 may be formed in a circular plate. The diameter of the baffle 42 is greater than the diameter of the sliding reel column 41, thereby enabling the flexible display panel 2 to be wound on the sliding reel column 41 without deviating from the sliding reel column 41. Alternatively, the baffle 42 may also be formed in various shapes such as a rectangle, a triangle, a trapezoid, and the like, as long as an outer surface of the baffle 42 protruding from the sliding reel column 41 limits deviation of the flexible display panel 2.

Figure 10:
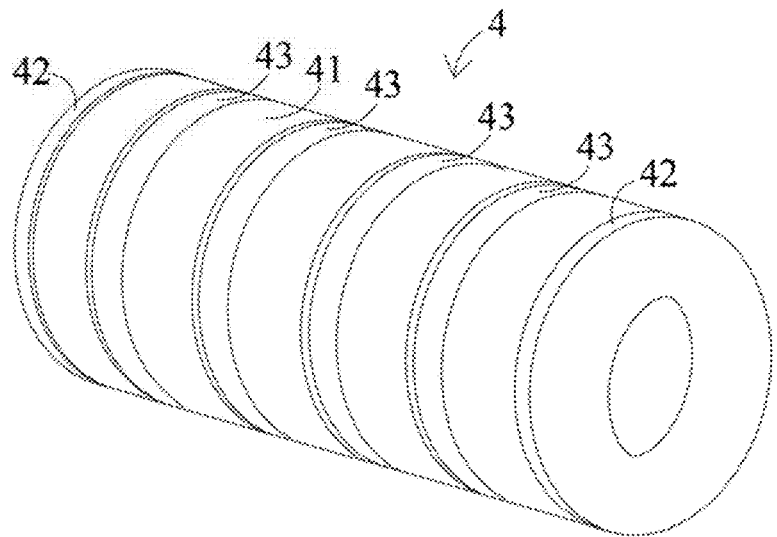
FIG. 10 is a schematic structural diagram of another exemplary embodiment of the sliding reel.

In some other exemplary embodiments of the disclosure, as shown in FIG. 10, a plurality of annular grooves 43 may be arranged on the sliding reel column 41 side by side along the axial direction of the sliding reel 4. The annular grooves 43 and the sliding reel column 41 are coaxially arranged, and an interval space is provided between any two adjacent annular grooves 43. In other words, the plurality of annular grooves 43 coaxial with the sliding reel column 41 are arranged at intervals on the cylindrical surface of the sliding reel column 41, so that the cylindrical surface of the sliding reel column 41 is formed as a structure in which concave and convex cylindrical surfaces are in alternative arrangement. A width of the annular groove 43 may be greater than or equal to 20 mm and less than or equal to 50 mm. Alternatively, the width of the annular groove 43 may be flexibly designed as required. The widths of the annular grooves 43 may be the same or different, and the width of the annular grooves 43 close to both ends of the sliding reel 4 may be designed to be greater, that is, the width of the annular groove 43 close to the baffle 42 is greater the width of the annular groove 43 away from the baffle 42.

Figure 11:
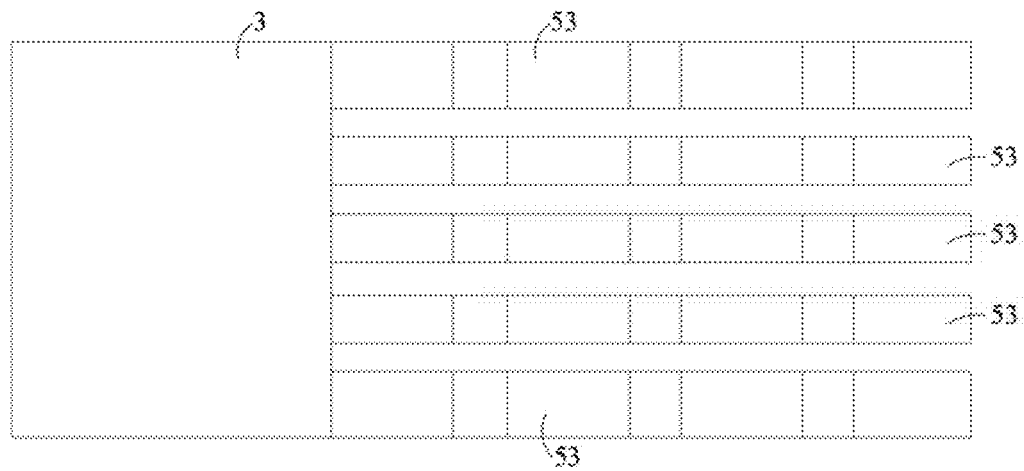
FIG. 11 is a schematic structural diagram of still another exemplary embodiment of the support member after being connected with the fixed support member.

In this case, as shown in FIG. 11, the support member 5 is provided as a plurality of support strips 53 side by side along the axial direction of the sliding reel 4. In other words, the support member 5 may include a plurality of support strips 53 arranged side by side along the axial direction of the sliding reel 4. A width of the support strip 53 may be greater than or equal to 20 mm and less than or equal to 50 mm. Each support strip 53 is matched with the annular groove 43, that is, one support strip 53 may be accommodated in one annular groove 43. In some embodiments, an interval space is provided between any two adjacent support strips 53, and the interval space is matched with the protrusion on the sliding reel 41. The width of the support strip 53 may be flexibly designed as required. The widths of the plurality of support strips 53 may be the same or different, and a width of the support strip 53 close to both ends of the sliding reel 4 may be designed to be greater, that is, the width of the support strip 53 close to the baffle 42 is greater than a width of the support strip 53 away from the baffle 42, so as to support two side edges of the flexible display panel 2 in the width direction, so that the flexible display panel 2 has better flatness. Alternatively, a plurality of protrusions matched with the annular grooves 43 may also be arranged on a surface of the support member 5 which is matched with the sliding reel 4, and the protrusions may be clamped into the annular grooves 43.

It should be noted that, according to the exemplary embodiment of the support member 5 as shown in FIG. 5, the exemplary embodiment of the support member 5 in which a coil is wound on the rigid support plate 51 and the exemplary embodiment of the support member 5 as shown in FIG. 8, the support member 5 may all be provided as a plurality of support strips 53 side by side along the axial direction of the sliding reel 4.

Further, exemplary embodiments also provide a sliding-scrolling method for the flexible display device, used for the flexible display device described in any one of the embodiments as described above, and the sliding-scrolling method may include the following steps:

moving the sliding reel 4 towards a side away from the fixed support member 3, and expanding the support member 5 and the flexible display panel 2 which are rolled on the sliding reel 4, where the support member 5 supports the flexible display panel 2.

In some exemplary embodiments, when the flexible display panel 2 is expanded to a preset position, the coil on the rigid support plate 51 is energized to enable the rigid support plate 51 to be attached to the flexible display panel 2.

Specifically, when in use, the user pulls the fixed support member 3 and the shell 1 with respect to each other, the fixed support member 3 slides outward in the guide groove of the shell 1, and the fixed support member 3 brings the flexible display panel 2 and the support member 5 to move outward. At the same time, the flexible display panel 2 and the support member 5 which are rolled on the sliding reel 4 are slowly flattened, and during this process, the support member 5 brings the sliding reel 4 to rotate, and the elastic member 6 is stretched and has constant tension. When the flexible display panel 2 is expanded to the preset position, the coil on the rigid support plate 51 is energized to enable the rigid support plate 51 to be attached to the flexible display panel 2. When rolling inward, the fixed support member 3 is loosen, and then the flexible display panel 2 is brought to retract into the shell and rolled on the sliding reel 4 under the tension of the elastic member 6. At the same time, the flexible display panel 2 brings the support member 5 to retract into the shell and roll on the sliding reel 4. During this process, the sliding reel 4 is also rotated; and the support member 5 and the flexible display panel 2 bring the fixed support member 3 to slide back to its original position.

The features, structures or characteristics described above may be combined in any suitable manner in one or more embodiments, and if possible, the features discussed in the various embodiments are interchangeable. In the above description, numerous specific details are provided in order to give a thorough understanding of the embodiments of the disclosure. Those skilled in the art will recognize, however, that aspects of the disclosure may be practiced without one or more of the specific details, or other methods, components, materials, and the like can be employed. In other cases, well-known structures, materials or operations are not shown or described in detail to avoid obscuring aspects of the disclosure.

The terms "about" and "approximately" used in this specification generally mean that a value is within 20%, preferably within 10%, and more preferably within 5% of a given value or range. The number given herein is an approximate number, which means that it can still imply the meanings of "about", "approximately", "roughly" and "substantially" without a specific description.

Although relative terms such as "on" and "under" are used in this specification to describe the relative relationship of one component to another component as illustrated, these terms are used in this specification only for convenience, for example according to a direction of the example described in the drawing. It can be appreciated that if the device as shown is turned upside down, then the component described as "on" will become the component described as "under". When a certain structure is "on" another structure, it may refer to that the certain structure is integrally formed on the another structure, or that the certain structure is "directly" arranged on the another structure, or that the certain structure is "indirectly" arranged on the another structure through still another structure.

In this specification, the terms "a" "an" "the" and "said" are used to indicate the presence of one or more elements/components/and the like; the terms "comprise" "include" and "have" are used to indicate an open-ended inclusion meaning and refer to that additional elements/components/and the like may be present in addition to the listed elements/components/and the like; and the terms "first" "second", "third", and the like are used only as markers, and not as restrictions on the number of objects.

It should be understood that the disclosure does not limit its application to the detailed structure and arrangement of components set forth in this specification. The disclosure may have other embodiments, and may be implemented and executed in various ways. The aforementioned variations and modifications fall within the scope of the disclosure. It should be understood that the disclosure disclosed and defined in this specification extends to all alternative combinations of two or more individual features mentioned or apparent in the text and/or drawings. All of these different combinations constitute various alternative aspects of the disclosure. The embodiments described in this specification illustrate the best mode known for carrying out the disclosure, and will enable those skilled in the art to utilize the disclosure.

What is claimed is:

1. A flexible display device, comprising:
a shell;
a flexible display panel, having a first end and a second end arranged opposite to each other;
a fixed support member, fixedly connected with the first end of the flexible display panel for supporting the first end of the flexible display panel, the fixed support member being movably connected to the shell;
a sliding reel, wherein the flexible display panel is rolled on the sliding reel, and the sliding reel is rotatably arranged in the shell; and
a support member, rolled on the sliding reel and located between the sliding reel and the flexible display panel, wherein an end of the support member is fixedly connected with the sliding reel, an opposite end of the support member is fixedly connected with the fixed support member, and the support member is configured to support the flexible display panel when the flexible display panel is expanded,
wherein the sliding reel comprises:
a sliding reel column; and
two baffles, correspondingly fixed at two opposite ends of the sliding reel column, wherein a diameter of the baffle is greater than a diameter of the sliding reel column.

2. The flexible display device according to claim 1, wherein the support member comprises:
a plurality of rigid support plates, extending along an axial direction of the sliding reel, and an interval space is provided between any two adjacent rigid support plates; and
a plurality of flexible support plates, extending along the axial direction of the sliding reel, and one flexible support plate is connected between any two adjacent rigid support plates.

3. The flexible display device according to claim 2, wherein a material of the rigid support plate is magnetically conductive metal.

4. The flexible display device according to claim 3, wherein a coil is wound outside the rigid support plate; and the flexible display panel comprises a metal support layer located on a side of the flexible display panel attaching with the support member, a material of the metal support layer is magnetically conductive metal, and the metal support layer is attached to the rigid support plate being energized.

5. The flexible display device according to claim 1, wherein a plurality of annular grooves are provided on the sliding reel column side by side along the axial direction of the sliding reel, and the annular grooves are coaxially arranged with the sliding reel column.

6. The flexible display device according to claim 5, wherein the support member comprises a plurality of support strips arranged side by side along the axial direction of the sliding reel, and each of the support strips is matched with one of the annular grooves.

7. The flexible display device according to claim 6, wherein a width of an annular groove close to the baffle is greater than a width of an annular groove away from the baffle, and a width of a support strip close to the baffle is greater than a width of a support strip away from the baffle.

8. The flexible display device according to claim 4, wherein a plurality of first protruding strips are arranged on a side of the support member matching with the flexible display panel, and the first protruding strips extend along the axial direction of the sliding reel.

9. The flexible display device according to claim 8, wherein a plurality of grooves matched with the first protruding strips are arranged on a side of the flexible display panel matching with the support member, and the grooves extend along the axial direction of the sliding reel.

10. The flexible display device according to claim 4, further comprising:
an elastic member, connected between the shell and the second end of the flexible display panel.

11. The flexible display device according to claim 1, wherein the support member is formed in a plate shape and provided with a plurality of through holes, and a material of the support member is metal or colloid.

12. A sliding-scrolling method for a flexible display device, wherein the flexible display device comprises: a shell; a flexible display panel, having a first end and a second end arranged opposite to each other; a fixed support member, fixedly connected with the first end of the flexible display panel for supporting the first end of the flexible display panel, the fixed support member being movably connected to the shell; a sliding reel, wherein the flexible display panel is rolled on the sliding reel, and the sliding reel is rotatably arranged in the shell; and a support member, rolled on the sliding reel and located between the sliding reel and the flexible display panel, wherein an end of the support member is fixedly connected with the sliding reel, an opposite end of the support member is fixedly connected with the fixed support member, and the support member is configured to support the flexible display panel when the flexible display panel is expanded,
wherein the sliding reel comprises:
a sliding reel column; and
two baffles, correspondingly fixed at two opposite ends of the sliding reel column,
wherein a diameter of the baffle is greater than a diameter of the sliding reel column, and
wherein the method comprises:
moving the sliding reel towards a side away from the fixed support member, and expanding the support member and the flexible display panel rolled on the sliding reel, wherein the support member is configured to support the flexible display panel.

13. The method according to claim 12, wherein the support member comprises:
a plurality of rigid support plates, extending along an axial direction of the sliding reel, and an interval space is provided between any two adjacent rigid support plates; and
a plurality of flexible support plates, extending along the axial direction of the sliding reel, and one flexible support plate is connected between any two adjacent rigid support plates.

14. The method according to claim 13, wherein a material of the rigid support plate is magnetically conductive metal.

15. The method according to claim 14, wherein a coil is wound outside the rigid support plate; and the flexible display panel comprises a metal support layer located on a side of the flexible display panel attaching with the support member, a material of the metal support layer is magnetically conductive metal, and the metal support layer is attached to the rigid support plate being energized.

16. The method according to claim 15, wherein when the flexible display panel is expanded to a preset position, the coil on the rigid support plate is energized so as to enable the rigid support plate to be attached to the flexible display panel.

17. The method according to claim 15, wherein a plurality of first protruding strips are arranged on a side of the support member matching with the flexible display panel, and the first protruding strips extend along the axial direction of the sliding reel.

18. The method according to claim 15, wherein the flexible display device further comprises:
an elastic member, connected between the shell and the second end of the flexible display panel.

* * * * *